United States Patent [19]

Moriizumi et al.

[11] Patent Number: 5,227,865
[45] Date of Patent: Jul. 13, 1993

[54] BICMOS SENSE AMPLIFIER HAVING INPUT WAITING STATE

[75] Inventors: Takashi Moriizumi, Tokyo; Tadahiro Kuroda, Kawasaki; Kazuhiko Kasai, Yokohama; Toshiyuki Fukunaga, Kawasaki, all of Japan

[73] Assignee: Kabushiki Kaisha Toshiba, Kawasaki, Japan

[21] Appl. No.: 812,935

[22] Filed: Dec. 24, 1991

[30] Foreign Application Priority Data

Dec. 26, 1990 [JP] Japan .................. 2-418373

[51] Int. Cl.⁵ .................. H03F 3/45; H03K 5/153
[52] U.S. Cl. .................. 307/530; 307/350; 307/354; 307/355; 307/360; 307/570; 307/446
[58] Field of Search .............. 307/350, 530, 354–355, 307/360, 570, 446

[56] References Cited

U.S. PATENT DOCUMENTS 4,845,442 7/1989 Chapin et al. .................. 307/530
4,980,578 12/1990 Shaffer et al. .................. 307/530

Primary Examiner—William L. Sikes
Assistant Examiner—M. Wambach
Attorney, Agent, or Firm—Finnegan, Henderson, Farabow, Garrett & Dunner

[57] ABSTRACT

A sense amplifier of this invention has a main characteristic feature in that it has low power consumption in an input waiting state, and can perform a highspeed sensing operation. The sense amplifier includes an output transistor, a constant current source connected between the base of the transistor and a first power source, a MOS transistor, having a source-drain path connected between the base of the transistor and a second power source, for receiving most of a current from the constant current source, and a load resistor for the transistor. The base potential of the output transistor in the input waiting state is set to be a value corresponding to a state immediately before or after the transistor is turned on.

7 Claims, 4 Drawing Sheets

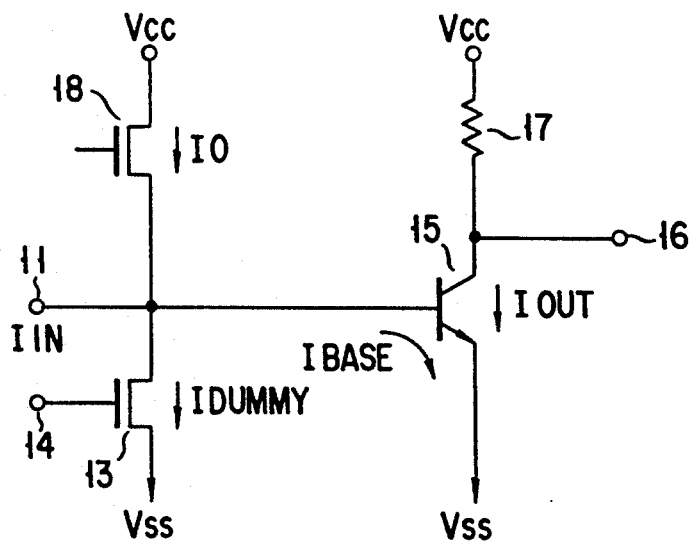
F I G. 4
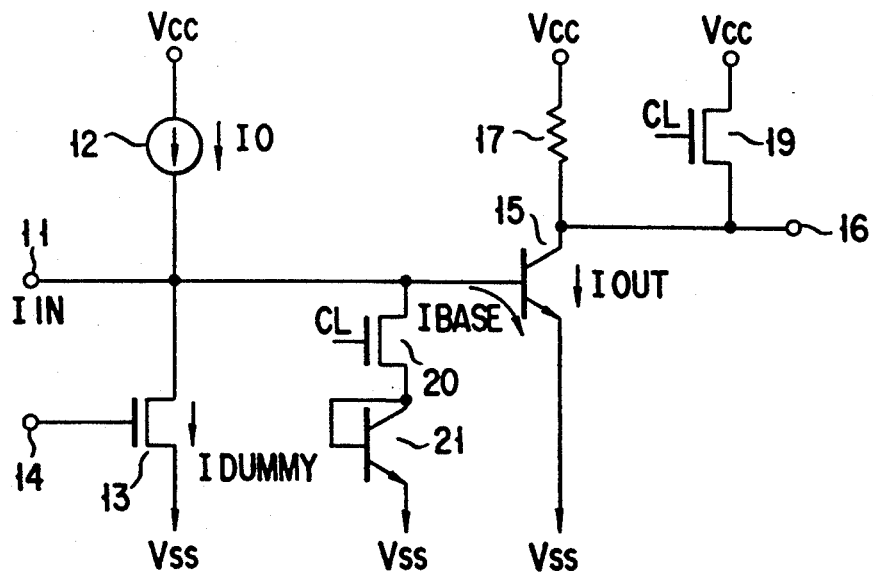
F I G. 5

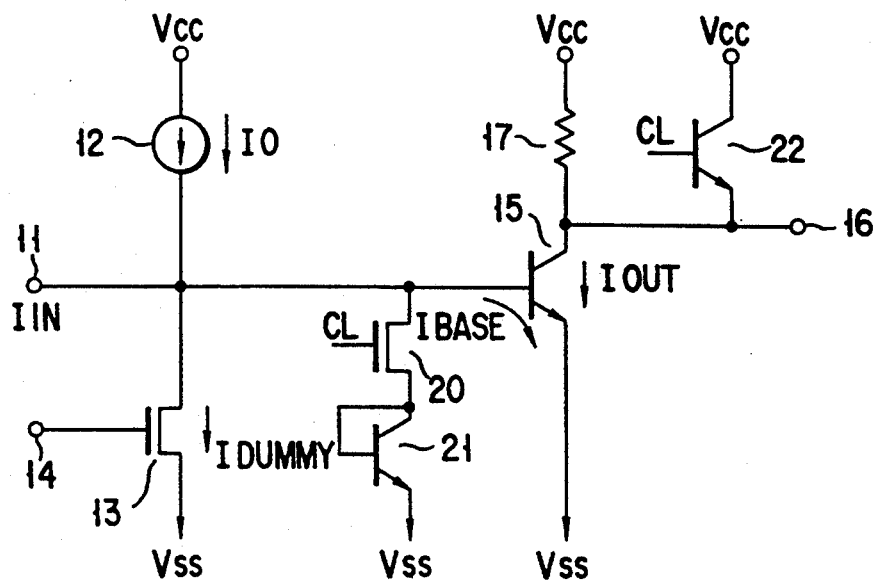
F I G. 6
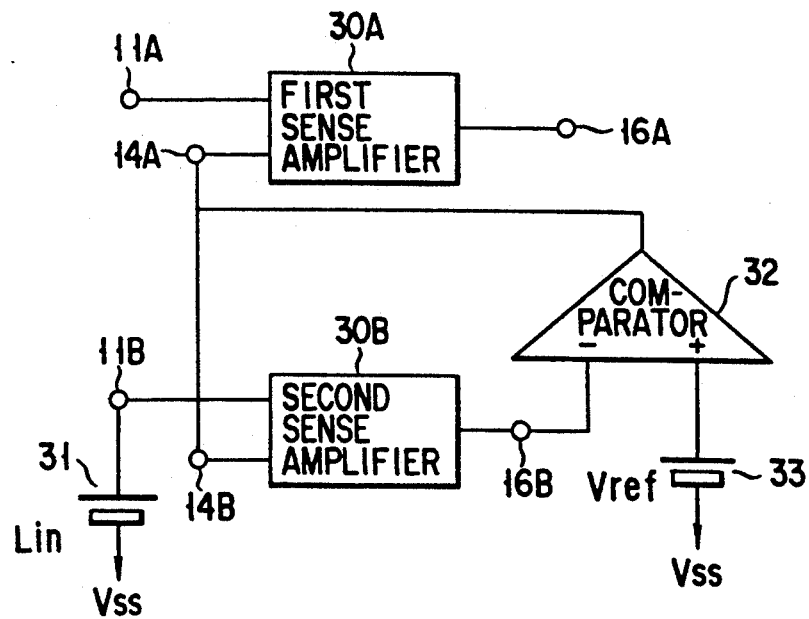
F I G. 7

5,227,865

BICMOS SENSE AMPLIFIER HAVING INPUT WAITING STATE

BACKGROUND OF THE INVENTION

1. Field of the Invention

The present invention relates to a one-input sense amplifier, arranged in an adder integrated circuit, for sensing a small signal of a carry signal transmitted from a lower digit to an upper digit.

2. Description of the Related Art

FIG. 1 is a one-input sense amplifier arranged in an adder integrated circuit to sense a carry signal.

This sense amplifier comprises an output npn bipolar transistor 43 having a base, emitter, and collector respectively connected to an input terminal 41, a power source for a ground voltage $V_{SS}$, and an output terminal 42, a load resistor 44 connected between the output terminal 42 and a power source for a positive voltage $V_{CC}$, a field effect transistor, e.g., a MOS transistor 45 having a source-drain path inserted between the input terminal 41 and the output terminal 42, and a MOS transistor 46 having a source-drain path inserted between the input terminal 41 and the voltage $V_{CC}$.

In the sense amplifier having the above arrangement, the potential of a precharge carry signal from a lower digit is generally applied as an input to the input terminal 41. The potential at the input terminal 41 of the sense amplifier is set at a predetermined potential in an input waiting state for waiting for a carry signal input. During the sensing period of the carry signal, however, the potential at the input terminal 41 is kept at the precharge potential obtained in the input waiting state or gradually changes therefrom.

Assume that the potential of the input terminal 41 is set to be Hin (Hin≧Vf where Vf is the threshold voltage of the base-emitter path of the bipolar transistor 43) in the input waiting state. At this time, the transistor 43 is set in an ON state, and a collector current flows therethrough, so that the potential at the output terminal 42 is set to be a low potential Lout determined by the ratio of the ON resistance of the transistor 43 to the resistance of the load resistor 44.

On the other hand, during the sensing period, when the potential of the input terminal 41 changes to be decreased to the low potential Lin lower than the threshold voltage Vf, the transistor 43 is turned off, and the collector current is cut off. At this time, the output terminal 42 is charged through the load resistor 44, and the output potential is set at a high potential Hout close to the voltage $V_{CC}$.

Note that the MOS transistor 45 is controlled to be set in an ON state when the potential of the input terminal 41 returns from the low potential Lin to the high potential Hin. The input terminal 41 is then charged by the potential of the output terminal 42, and the input potential can be easily increased to the high potential Hin. Note that the MOS transistor 46 comprises a bias MOS transistor for supplying a current to the base of the output transistor 43.

In the conventional sense amplifier described above, since the output transistor 43 is kept on in the input waiting state, a through current flows across the power sources, thus increasing power consumption in the input waiting state. Since the output terminal is charged through the load resistor to obtain a potential different from that in the input waiting state, a high-speed sensing operation cannot be performed.

SUMMARY OF THE INVENTION

The present invention has been made in consideration of the above situation.

It is an object of the present invention to provide a sense amplifier, which has low power consumption in an input waiting state and can perform a high-speed sensing operation.

In order to achieve the above object of the present invention, there is provided a sense amplifier comprising:

a first input terminal for receiving a carry signal to be sensed;

an output terminal for outputting a sensed signal;

first and second power sources;

a constant current source circuit connected between the first input terminal and the first power source;

a field effect transistor having a source-drain path connected between the first input terminal and the second power source;

an output bipolar transistor having a base, collector, and emitter respectively connected to the first input terminal, the output terminal, and the second power source;

a load element connected between the output terminal and the first power source; and a second input terminal, connected to a gate of the field effect transistor, for receiving a bias voltage for controlling the bipolar transistor so that a state immediately before or after the bipolar transistor is turned on is set in an input waiting state for waiting for reception of the carry signal from the first input terminal to the base of the output bipolar transistor.

In the sense amplifier according to the present invention, since a predetermined bias potential is applied to the second input terminal, in the input waiting state, most of the current of the constant current source circuit flows in the field effect transistor, and part of the current of the constant current source circuit flows in the base of the output bipolar transistor. By adjusting the value of the bias potential at the second input terminal, the state immediately before or after the output bipolar transistor is turned on is set in the input waiting state. At this time, the output potential is set at a high potential, and no large current flows across the power sources. When the potential at the first input terminal is increased in the input waiting state, and an input current flows from the first input terminal, most of the input current flows as a base current to the output bipolar transistor, thereby quickly decreasing the output potential to the low potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing a modification of the first embodiment of the present invention;

FIG. 5 is a circuit diagram of a sense amplifier according to the second embodiment of the present invention;

FIG. 6 is a circuit diagram of a sense amplifier according to the third embodiment of the present invention; and FIG. 7 is a circuit diagram of a sense amplifier according to the fourth embodiment of the present invention.

DETAILED DESCRIPTION OF THE PREFERRED EMBODIMENTS

Preferred embodiments of the present invention will be described with reference to the accompanying drawings.

Figure 1:
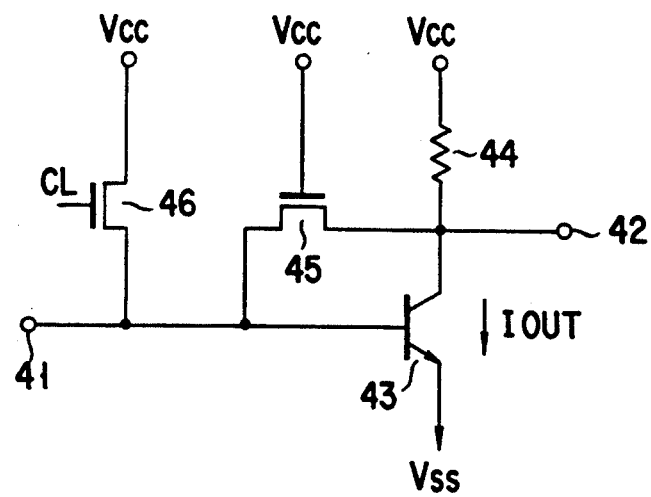
FIG. 1 is a circuit diagram showing a conventional sense amplifier.
Figure 2:
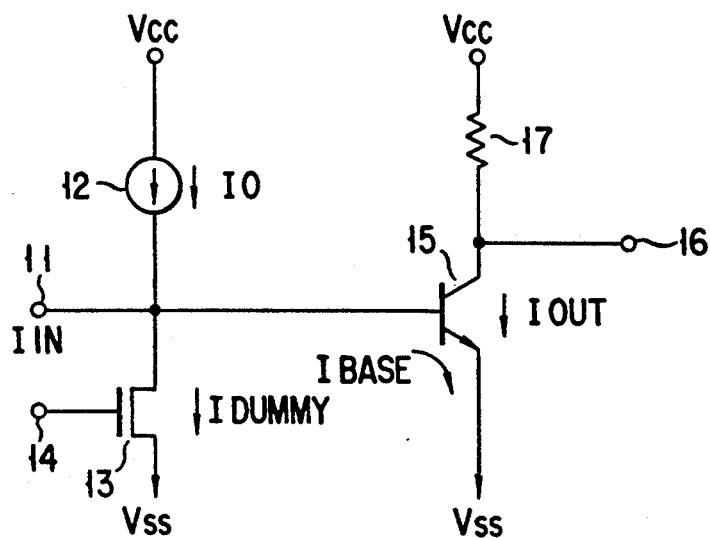
FIG. 2 is a circuit diagram showing a sense amplifier according to the first embodiment of the present invention.

FIG. 2 is a circuit diagram of a sense amplifier according to the first embodiment of the present invention. The first embodiment exemplifies a sense amplifier for sensing a carry signal in an adder. Referring to FIG. 2, a constant current source 12 having a current value IO is inserted between an input terminal 11 and a first power source for supplying a positive voltage $V_{CC}$. The source-drain path of a field effect transistor such as a MOS transistor 13 is connected between the first input terminal 11 and a second power source for supplying a ground voltage $V_{SS}$. The gate of the MOS transistor 13 is connected to a second input terminal 14.

The base of an npn bipolar transistor 15 is connected to the first input terminal 11. The collector of the transistor 15 is connected to an output terminal 16, and the emitter of the transistor 15 is connected to the second power source as the ground voltage $V_{SS}$. A load resistor 17 is connected between the output terminal 16 and the first power source as the voltage $V_{CC}$.

A predetermined bias is input to the second input terminal 14. Most of the current of the constant current source 12 flows in the MOS transistor 13 for a period of time during which the potential at the first input terminal 11 is set at a potential in an input waiting state for waiting for the carry signal. The MOS transistor 13 is set in a state immediately before it is saturated. In addition, part of the current of the constant current source 12 flows in the base of the bipolar transistor 15, so that the base potential of the transistor 13 is set at a potential slightly lower or higher than a threshold voltage (Vf) between the base and emitter of the transistor 15.

In the input waiting state, i.e., in a state wherein a carry signal to be sensed is not input from the first input terminal to the bipolar transistor 15, the transistor 15 is set in a state immediately before or after it is turned on. The value of the current Iout flowing in the collector of the transistor 15 becomes small. The potential of the output terminal 16 in the input waiting state is set at a high potential Hout close to the voltage $V_{CC}$. In the input waiting state, the current of the constant current source 12 flows in the second power source as the ground voltage $V_{SS}$ through the MOS transistor 13, and a through current flows across the first and second power sources. If a MOS transistor 13 having a small size, however, is used in the circuit diagram shown in FIG. 2, the value of the current flowing across the first and second power sources can be set very small.

A sensing period of the carry signal is started at the end of the precharge period. At this time, when the potential at the first input terminal 11 is not changed, the high potential Hout is output from the output terminal 16 as in the input waiting state.

Figure 3:
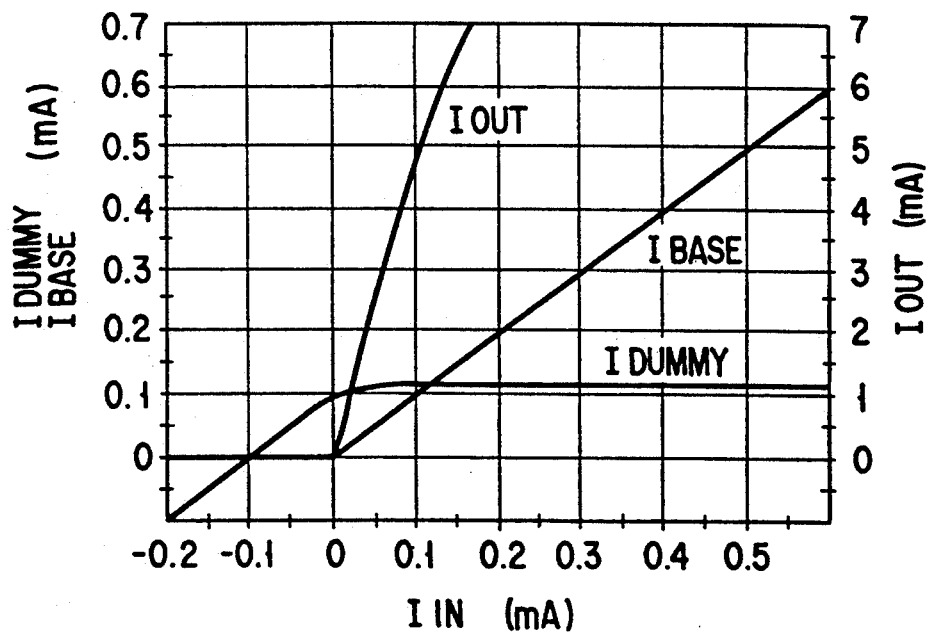
FIG. 3 is a graph showing relationships between the current input to a second input terminal of the sense amplifier shown in FIG. 2 and the source-drain current of a MOS transistor, and between the base and collector currents of a bipolar transistor.

On the other hand, when the potential at the first input terminal 11 is increased and an input current Iin as the carry signal flowing from the first input terminal 11 is increased, the MOS transistor 13 is immediately set in a saturated state, and its drain current Idummy is hardly increased, as shown in FIG. 3. To the contrary, a base current Ibase of the bipolar transistor 15 is increased in proportion to an increase in the input current Iin. The ON state of the bipolar transistor 15 is enhanced to abruptly increase a collector current Iout, as shown in FIG. 3. When the transistor 15 is turned on, the potential at the output terminal 16 is changed from the high potential Hout to the low potential Lout.

Since the transistor 15 is turned on upon supply of a small base current, the potential at the, first input terminal 11 needs to be increased very little from that in the input waiting state. For this reason, even if a relatively large capacitor is connected to the first input terminal 11, an output potential can be inverted at high speed by a very small change in input current.

FIG. 4 is a circuit diagram showing a modification of the sense amplifier of the first embodiment shown in FIG. 2. In this modification, a MOS transistor 18 for receiving a predetermined bias voltage is used as the constant current source 12.

FIG. 5 is a circuit diagram showing the second embodiment of the present invention. The same reference numerals as in the embodiment of FIG. 2 denote the same parts in the embodiment of FIG. 5. In the circuit of the second embodiment, the source-drain path of a switching element, e.g., a MOS transistor 19 for immediately setting an output terminal 16 to a high potential Hout of the input setting state upon sensing of the carry signal after the potential at the output terminal 16 is determined is inserted between the first power source as a voltage $V_{CC}$ and the output terminal 16. In order to immediately turn off an output bipolar transistor 15 upon sensing of the carry signal and to set the potential of a first input terminal 11 to a value close to a base-emitter threshold value of the transistor 15, the source-drain path of a switching element, e.g., a MOS transistor 20 and the base-emitter path of a p-n junction element such as an npn bipolar transistor 21 having a short-circuited collector-base path are connected in series between the first input terminal 11 and a ground voltage $V_{SS}$.

With this arrangement, when sensing of the carry signal is completed, a control signal CL is supplied to the gates of the MOS transistors 19 and 20 to turn them on. When the MOS transistor 19 is turned on, the output terminal 16 is immediately set at the high potential Hout through the transistor 19.

On the other hand, when the MOS transistor 20 is turned on, the base current having flown in the output bipolar transistor 15 is discharged to the second power source as the ground voltage $V_{SS}$ through the MOS transistor 20 and the bipolar transistor 21, and the output bipolar transistor 15 is immediately turned off. In addition, since the base-emitter path of the bipolar transistor 21 is connected between the first input terminal 11 and the ground voltage $V_{SS}$, the base potential of the output bipolar transistor 15, i.e., the potential of the first input terminal 11 is set to be a value close to the base-emitter threshold voltage of the transistor 15.

FIG. 6 is a circuit diagram of a sense amplifier according to the third embodiment of the present invention. In the sense amplifier of the third embodiment, an npn bipolar transistor 22 is used in place of the MOS transistor 19 in the sense amplifier of the second embodiment (FIG. 5). That is, the collector of the bipolar transistor 22 is connected to the first power source as a voltage $V_{CC}$ and the emitter of the transistor 22 is connected to an output terminal 16. A control signal CL is supplied to the base of the transistor 22.

FIG. 7 is a circuit diagram of a sense amplifier according to the fourth embodiment of the present invention.

The sense amplifier of this embodiment comprises first and second sense amplifiers 30A and 30B each having the same arrangement as each of the amplifiers shown in FIGS. 2, 4, 5, and 6. In order to set a base-emitter voltage of an output bipolar transistor to a desired value (i.e., a base-emitter threshold voltage Vf) in the input waiting state and to set potentials of third and fourth input terminals 111A and 11B (to be described in detail later) for receiving sensed signals to a state immediately before or after the output bipolar transistor is appropriately turned on in a normal atmospheric state even in the presence of slight changes in temperature, a circuit for generating a bias voltage applied to fifth and sixth input terminals 14A and 14B is arranged.

Referring to FIG. 7, the third and fifth input terminals and the first output terminal of the first sense amplifier 30A are denoted by 11A, 14A, and 16A, respectively, and the fourth and sixth input terminals and the second output terminal of the second sense amplifier 30B are denoted by 11B, 14B, and 16B, respectively. A signal to be sensed is input to the third input terminal 11A of the first sense amplifier 30A, and a sensed signal is output from the first output terminal 16A.

On the other hand, a constant voltage source 31 having a voltage value Lin equal to a desired value set in the third input terminal 11A in the input waiting state is connected to the fourth input terminal 11B of the second sense amplifier 30B. The second output terminal 16B of the second sense amplifier 30B is connected to the non-inverting input terminal (+) of a voltage comparator 32. A constant voltage source 33 having a voltage value Vref equal to a potential output from the first output terminal 16A upon biasing of the base of the output bipolar transistor in the first sense amplifier 30A to a desired state is connected to the inverting input terminal (−) of the voltage comparator 32. An output potential of the voltage comparator 32 is input in parallel to input terminal 14A of the first sense amplifier 30A and the sixth input terminal 14B of the second sense amplifier 30B.

Assume that the non-inverting and inverting input terminals of the voltage comparator 32 are connected as follows. That is, when bias potentials input to the fifth and sixth input terminals 14A and 14B of the first and second sense amplifiers 30A and 30B are set to be high, the output potential in the input waiting state is increased, and when the bias potentials input to the fifth and sixth input terminals 14A and 14B are decreased, the output potential in the input waiting state is decreased. In this case, the second output terminal 16B of the second sense amplifier 30B is connected to the inverting input terminal of the voltage comparator 32, and the Vref constant voltage source 33 having the voltage value Vref is connected to the non-inverting input terminal of the voltage comparator 32.

Assume again that the non-inverting and inverting input terminals of the voltage comparator 32 are connected as follows. That is, when the bias potentials input to the fifth and sixth input terminals 14A and 14B of the first and second sense amplifiers 30A and 30B are set to be high, the output potential in the input waiting state is decreased; and when the bias potentials input to the fifth and sixth input terminals 14A and 14B are decreased, the output potential in the input waiting state is increased. In this case, the output terminal 16B of the second sense amplifier 30B must be connected to the non-inverting input terminal of the voltage comparator 32, and the constant voltage source 33 having the voltage value Vref must be connected to the inverting input terminal of the voltage comparator 32 because the direction of change in output potential is different in accordance with whether an n-channel transistor or a p-channel transistor is used as the MOS transistor 13.

With the above arrangement, an output signal of the voltage comparator 32 has a level which is in inverse proportion to the potential level at the output terminal of the second sense amplifier 30B. Therefore, the potential level at output terminal 16B of the second amplifier 30B is maintained at the predetermined value. As a result, the base potential of the output bipolar transistor 15 in the first sense amplifier 30A for performing actual input sensing can always be controlled to a desired potential in the input waiting state. In addition, even if a fabrication process varies or power source voltages and ambient temperature change, the base potential of the output bipolar transistor can be automatically controlled to coincide with a desired potential. Therefore, the operation margins and the fabrication margins, and the product yield can be increased.

As has been described above, according to the present invention, there is provided a sense amplifier which has low power consumption in an input waiting state and can perform a high-speed sensing operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:
1. A sense amplifier comprising:
a first input terminal for receiving a signal to be sensed;
an output terminal for outputting a sensed signal;
first and second power sources;
a constant current source circuit connected between said first input terminal and said first power source;
a field effect transistor having a source-drain path connected between said first input terminal and said second power source;
an output bipolar transistor having a base, collector, and emitter respectively connected to said first input terminal, said output terminal, and said second power source;

a load element connected between said output terminal and said first power source; and a second input terminal, connected to a gate of said field effect transistor, for receiving a bias voltage having an intermediate level for controlling said output bipolar transistor so that during an input waiting state a state immediately before or after said output bipolar transistor is turned on is set at said first input terminal.

2. An amplifier according to claim 1, wherein said constant current source circuit comprises a field effect transistor having a gate for receiving a predetermined bias voltage.

3. A sense amplifier comprising:

a first input terminal for receiving a signal to be sensed;

an output terminal for outputting a sensed signal;

first and second power sources;

a constant current source circuit connected between said first input terminal and said first power source;

a first field effect transistor having a source-drain path connected between said first input terminal and said second power source;

a first bipolar transistor having a base, collector, and emitter respectively connected to said first input terminal, said output terminal, and said second power source;

a load element connected between said output terminal and said first power source;

a second input terminal, connected to a gate of said first field effect transistor, for receiving a bias voltage for controlling said first bipolar transistor so that during an input waiting state a state immediately before or after said first bipolar transistor is turned on is set at said first input terminal;

a first switching element having a collector-emitter path connected between said first power source and said output terminal and controlled to be set in an ON state upon output of the sensed signal from said output terminal;

a second switching element having a source-drain path connected between said first input terminal and said second power source and controlled to be set in an ON state upon output of the sensed signal from said output terminal; and a p-n junction element connected in series with said second switching element.

4. An amplifier according to claim 3, wherein said first switching element comprises a bipolar transistor and said second switching element comprises a field effect transistor.

5. An amplifier according to claim 3, wherein said constant current source circuit comprises a field effect transistor having a gate for receiving a predetermined bias voltage.

6. A sense amplifier comprising:

first and second sense amplifiers each having a first input terminal, an output terminal for a sensed signal, first and second power sources, a constant current source circuit connected between said first input terminal and said first power source, a field effect transistor having a source-drain path connected between said first input terminal and said second power source, an output bipolar transistor having a base, collector, and emitter respectively connected to said first input terminal, said output terminal, and said second power source, a load element connected between said output terminal and said first power source, and a second input terminal connected to a gate of said field effect transistor;

first potential generating means for supplying to said first input terminal of said second sense amplifier a potential corresponding to a potential of said first input terminal of said first sense amplifier when said first sense amplifier is set in an input waiting state; and control means for controlling the potential at said output terminal of said second sense amplifier t a predetermined value.

7. The sense amplifier of claim 6, further comprising:

second potential generating means for generating a potential corresponding to a potential of said output terminal of said first sense amplifier existing when said first sense amplifier is set in the input waiting state, wherein said control means includes means for controlling the potential at said output terminal of the second sense amplifier at the predetermined value according to the potential generated by the second potential generating means.

* * * * *

UNITED STATES PATENT AND TRADEMARK OFFICE
CERTIFICATE OF CORRECTION

PATENT NO. : 5,227,865
DATED : July 13, 1993
INVENTOR(S) : Takashi Moriizumi et al.

It is certified that error appears in the above-indentified patent and that said Letters Patent is hereby corrected as shown below:

On title page, item [57] Abstract, line 3, change "highspeed" to --high-speed--.

Line 6, change "a" (second occurrence) to --an--.

Claim 6, column 8, line 36, change "t" to --at--.

Signed and Sealed this

Fifth Day of July, 1994

Attest:

Attesting Officer

BRUCE LEHMAN

Commissioner of Patents and Trademarks